(12) United States Patent
Jung et al.

(10) Patent No.: US 8,765,511 B2
(45) Date of Patent: Jul. 1, 2014

(54) SEMICONDUCTOR DEVICE AND METHOD FOR MANUFACTURING THE SAME

(71) Applicant: Dongbu HiTek Co., Ltd., Gyeonggi-do (KR)

(72) Inventors: Chung Kyung Jung, Gyeonggi-do (KR); Sung Wook Joo, Gyeongsangnam-do (KR)

(73) Assignee: Dongbu HiTek Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/826,674

(22) Filed: Mar. 14, 2013

(65) Prior Publication Data

US 2014/0077370 A1 Mar. 20, 2014

(30) Foreign Application Priority Data

Sep. 20, 2012 (KR) .................. 10-2012-0104395

(51) Int. Cl.
| | | |
|---|---|---|
| *H01L 21/00* | (2006.01) | |
| *H01L 21/44* | (2006.01) | |
| *H01L 21/4763* | (2006.01) | |
| *H01L 21/302* | (2006.01) | |
| *H01L 21/461* | (2006.01) | |
| *H01L 21/768* | (2006.01) | |
| *B81B 7/00* | (2006.01) | |
| *H01L 23/498* | (2006.01) | |
| *H01L 21/48* | (2006.01) | |
| *H01L 21/52* | (2006.01) | |
| *H01L 29/40* | (2006.01) | |
| *G01P 15/00* | (2006.01) | |
| *G01P 15/135* | (2006.01) | |
| *H01H 35/02* | (2006.01) | |
| *H01H 35/14* | (2006.01) | |

(52) U.S. Cl.
CPC ............ *H01L 21/76843* (2013.01); *B81B 7/00* (2013.01); *H01L 23/49816* (2013.01)
USPC ............. 438/50; 438/666; 438/612; 438/740; 438/634; 257/780; 257/E23.021; 200/61.45 R; 200/61.52; 73/514.01

(58) Field of Classification Search
USPC ......... 438/14, 15, 50, 51, 612, 666, 634, 740; 257/14, 737, 738, 780, E29.324, 257/E23.021, E23.069; 200/61.45 R, 61.51, 200/61.52, 61.53, 61.48, 277; 73/514.01, 73/514.16, 514.32, 514.35, 514.36, 73/514.37, 514.38, 488; 340/689
See application file for complete search history.

(56) References Cited

U.S. PATENT DOCUMENTS 4,807,021 A * 2/1989 Okumura ...................... 257/777
5,410,113 A * 4/1995 Mielke ................... 200/61.45 R
(Continued)

FOREIGN PATENT DOCUMENTS

| JP | 2009-238715 | 10/2009 |
|---|---|---|
| KR | 10-0833508 | 5/2008 |
| KR | 2009-0094072 | 9/2009 |

OTHER PUBLICATIONS

Jan. 17, 2014, communication from the Korean Patent Office in a related Korean application.

*Primary Examiner* — Mary Wilczewski
*Assistant Examiner* — Erik T Peterson
(74) *Attorney, Agent, or Firm* — Sherr & Jiang, PLLC (57) ABSTRACT

A method for manufacturing a semiconductor device including at least one of the following steps: (1) Forming a lower electrode pattern on/over a substrate. (2) Forming a first interlayer insulating layer on the lower electrode pattern. (3) Forming an upper electrode pattern on the first interlayer insulating layer. (4) Forming a passivation layer on a side of the upper electrode pattern. (5) Forming a second interlayer insulating layer on the upper electrode pattern. (6) Etching the second interlayer insulating layer to form a cavity which exposes the passivation layer. (7) Forming a contact ball in the cavity.

7 Claims, 5 Drawing Sheets

(56) References Cited

U.S. PATENT DOCUMENTS

| | | | |
|---|---|---|---|
| 5,668,399 A * | 9/1997 | Cronin et al. | 257/532 |
| 5,987,988 A * | 11/1999 | Kunimi et al. | 73/514.01 |
| 6,137,062 A * | 10/2000 | Zimmerman | 174/260 |
| 6,809,421 B1 * | 10/2004 | Hayasaka et al. | 257/777 |
| 6,943,339 B2 * | 9/2005 | Figueria et al. | 250/222.1 |
| 7,088,258 B2 * | 8/2006 | Morrison | 340/689 |
| 7,202,679 B2 * | 4/2007 | Maruyama et al. | 324/754.16 |
| 7,233,061 B1 * | 6/2007 | Conn | 257/686 |
| 7,241,641 B2 * | 7/2007 | Savastiouk et al. | 438/106 |
| 7,381,916 B2 | 6/2008 | Wong | |
| 7,649,150 B2 * | 1/2010 | Masuda | 200/61.45 R |
| 7,897,887 B2 * | 3/2011 | Blank | 200/61.45 R |
| 7,937,846 B2 * | 5/2011 | Ozawa | 33/365 |
| 8,146,432 B2 * | 4/2012 | Shimase | 73/649 |
| 8,181,354 B2 * | 5/2012 | Ozawa | 33/365 |
| 8,416,094 B2 * | 4/2013 | Dery et al. | 340/669 |
| 2004/0045354 A1 * | 3/2004 | Lentner et al. | 73/504.04 |
| 2008/0037075 A1 * | 2/2008 | Masuda | 358/482 |
| 2010/0059345 A1 * | 3/2010 | Blank | 200/61.45 R |
| 2011/0088478 A1 * | 4/2011 | Shimase | 73/649 |
| 2011/0179657 A1 * | 7/2011 | Ozawa | 33/377 |
| 2012/0050057 A1 * | 3/2012 | Dery et al. | 340/669 |

\* cited by examiner

SEMICONDUCTOR DEVICE AND METHOD FOR MANUFACTURING THE SAME

This application claims the benefit of the Patent Korean Application No. 10-2012-0104395, filed on Sep. 20, 2012, which is hereby incorporated by reference in its entirety.

BACKGROUND

Embodiments relate to a semiconductor device and a method for manufacturing a semiconductor device. Embodiments relate to a Micro Metal Sphere switch and a method for manufacturing a Micro Metal Sphere. A MEMs (e.g. Micro Metal Sphere system) device is a device having a micro-scale size for performing a particular function (e.g. such as an electro-mechanical operation). MEMs devices may be produced by a special semiconductor process with low priced batch manufacturing.

MEMs devices have many applications (e.g. sensors). Examples of sensors are pressure sensors, inertia sensors, position sensors in GPS systems and game consoles, image sensors in digital cameras, camcorders, RF switches, micro-resonators, variable capacitors, variable inductor, and similar. MEMs device for switch applications may require consistent quality and/or assured reliability for switches. Manufacturing techniques should be optimized to assure a stable yield.

SUMMARY

Embodiments relate to a semiconductor device and a method for manufacturing a semiconductor device. Embodiments relate to a semiconductor device with an upper electrode pattern that is insensitive to etchant used in wet etching. Accordingly, in embodiments, a semiconductor device may be optimized by securing space for positioning a contact ball therein, which may improve degrees of freedom of the upper electrode pattern. In embodiments, reliability of a switching action of the semiconductor device may be optimized without significant sacrifices to manufacturing yield.

Embodiments relate to a method for manufacturing a semiconductor device including at least one of the follow steps: (1) Forming a lower electrode pattern on/over a substrate, (2) forming a first interlayer insulating layer on/over the lower electrode pattern, (3) forming an upper electrode pattern on/over the first interlayer insulating layer, (4) forming a passivation layer on/over a side of the upper electrode pattern, (5) forming a second interlayer insulating layer on/over the upper electrode pattern, (6) etching the second interlayer insulating layer to form a cavity which exposes the passivation layer, and/or (7) forming a contact ball in the cavity.

In embodiments, the step of forming a passivation layer may include the step of oxidizing at least a portion of a side of the upper electrode pattern to form the passivation layer. In embodiments, the step of forming an upper electrode pattern may include the step of forming a plurality of upper electrodes spaced from one another on the first interlayer insulating layer.

The step of forming an upper electrode pattern may include the step of forming the plurality of upper electrodes each having a stack of a lower barrier layer, a main electrode layer, and an upper electrode layer, in accordance with embodiments. In embodiments, the cavity may expose the lower barrier layer and the upper barrier layer adjacent to the exposed passivation layer.

In embodiments, the step of forming a passivation layer may include the step of oxidizing the side of the main electrode layer to form the passivation layer. In embodiments, the step of forming a passivation layer may include the step of oxidizing a portion of the main electrode layer positioned between an edge of the lower barrier layer and an edge of the upper barrier layer to form the passivation layer.

The passivation layer may have a thickness between approximately 5 Å and 100 Å, in accordance with embodiments. The main electrode layer may be formed of at least one of Al, Cu, Au, an Al—Cu alloy, or similar. The lower barrier layer and/or the upper barrier layer may be formed of at least one of TiN, Ti, a TiN/Ti alloy, or similar. The passivation layer may include at least one of Al2O3, Cu2O, AuOX (Where, "X" is a real number) or an oxidized Al—Cu alloy.

In embodiments, in the step of forming a stop film, the stop film is formed between the lower electrode pattern and the first interlayer insulating layer. In embodiments, a method may include a step of forming a contact in contact with the lower electrode pattern passed through the first interlayer insulating layer and the stop film. In embodiments, a method may include a step of forming a second upper electrode pattern in contact with the contact. In embodiments, the first insulating layer and the second insulating layer may include at least one of SiO2, SixNy (where, x, and y are real numbers), FSG (Fluoro Silicate glass), USG (Undoped Silicate Glass), BPSG (Boron Phospho Silicate Glass), TEOS (TetraEthOxySilane), and/or similar.

The cavity may expose a side of the lower barrier layer, a portion of an underside of the lower barrier layer adjacent to the side of the exposed lower barrier layer, a side of the upper barrier layer, and/or a portion of an upper side of the upper barrier layer adjacent to the side of the exposed upper barrier layer. The step of forming a cavity may include exposing the stop film, and forming a contact ball on the stop film, in accordance with embodiments.

In embodiments, a semiconductor device may include at least one of (1) a substrate, (2) a lower electrode pattern formed on/over the substrate, (3) a stop film formed on/over the lower electrode pattern, (4) a first interlayer insulating layer formed on/over the stop film, (5) an upper electrode pattern formed on/over the first interlayer insulating layer, (6) a passivation layer formed on/over a portion of a side of the upper electrode pattern, (7) a second interlayer insulating layer formed on the upper electrode pattern, (8) a cavity formed in the first interlayer insulating layer and the second interlayer insulating layer which exposes the passivation layer and a contact ball formed in the cavity.

In embodiments, the upper electrode pattern may include a plurality of upper electrodes spaced apart from one another. In embodiments, each of the plurality of upper electrodes includes a stack of a lower barrier layer, a main electrode layer, and an upper barrier layer. In embodiments, the passivation layer may be formed on a side of the main electrode layer to expose the lower electrode layer and the upper electrode layer. In embodiments, the passivation layer may be positioned between an edge of the lower barrier layer and an edge of the upper barrier layer. In embodiments, a semiconductor device may include a contact which connects the lower electrode pattern to the upper electrode pattern passed through the first interlayer insulating layer and the stop film.

Embodiments may allow for the formation of an upper electrode pattern which is insensitive to etchant used in wet etching for securing a space for positioning a contact ball. In embodiments, this formation may improve degrees of freedom of the upper electrode pattern compared to the related art. In embodiments, this formation may assure reasonable reliability of switching actions of the semiconductor device. In embodiments, this formation may optimize the manufacturing yield.

DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

Example

Example

DESCRIPTION

Example FIGS. 2 to 9 illustrate sections and a method for manufacturing a semiconductor device in accordance embodiments. For an example, some embodiments relate to a method for manufacturing an MEM (Micro Metal Sphere) switch.

Figure 2:
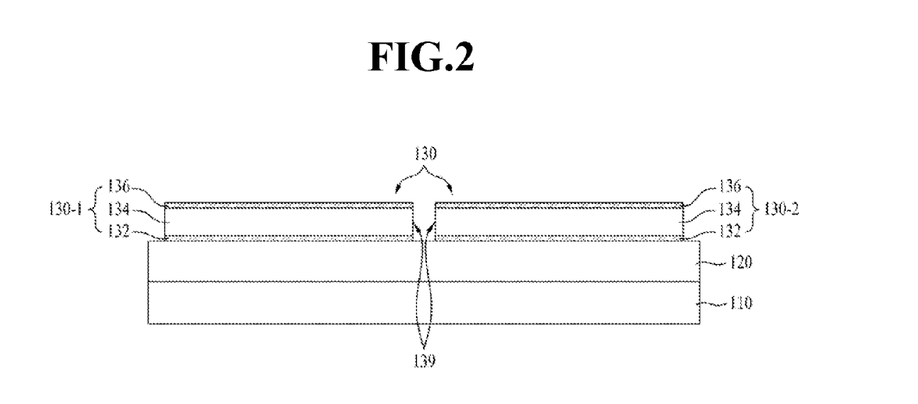
FIGS. 2 to 9 illustrate steps of an exemplary method for manufacturing a semiconductor device, in accordance with embodiments.

Referring to FIG. 2, an insulating layer 120 may be formed on a substrate 110, in accordance with embodiments. The substrate 110 may be a mono-crystalline silicon substrate, a poly-crystalline silicon substrate, and/or a semiconductor substrate. The substrate 110 may have a device isolation film (not shown) formed on/over the substrate 110, which (in embodiments) may divide an active region and a device isolation region. In embodiments, the substrate 110 may have p type impurities or n type impurities doped therein.

The insulating layer 120 may include at least one of oxide or nitride and may be either single-layered or multi-layered. For example, the insulating layer 120 may be deposited on the substrate by CVD (Chemical Vapor Deposition), in accordance with embodiments. In embodiments insulating layer 120 may include at least one of (but not limited to) SiO2, SixNy (where, x, and y are real numbers), FSG (Fluoro Silicate glass), USG (Undoped Silicate Glass), BPSG (Boron Phospho Silicate Glass), TEOS (TetraEthOxySilane), and/or similar.

A lower electrode pattern 130 may be formed on the insulating layer 120. The lower electrode pattern 130 may have a structure having a stack of a first barrier layer 132, a first main electrode layer 134, and/or a second barrier layer 136. The first barrier layer 132 and the second barrier layer 136 may prevent metal ions of the first main electrode layer 134 from diffusing to other layer (e.g. the insulating layer 120).

In embodiments, the first and the second barrier layers 132 and 136 may be formed of a material which blocks or substantially blocks diffusion of the metal ions (e.g. TiN, Ti, a TiN/Ti alloy, and/or similar). In embodiments, the first main electrode layer 134 may be formed of a material having good conductivity (e.g. Al, Au, Cu, an Al—Cu alloy, and/or similar).

The lower electrode pattern 130 may include a plurality of lower electrodes (e.g. 130-1 and 130-2) spaced apart from each other for substantial electrical isolation from each other, in accordance with embodiments. For example, the lower electrode pattern 130 may include a first lower electrode 130-1 and a second lower electrode 130-2 spaced from each other, in accordance with embodiments. Although FIG. 2 illustrates only two lower electrodes 130-1 and 130-2, any practical number of lower electrodes may be used in accordance with embodiments (e.g three or more).

For example, by depositing the first barrier layer 132, the first main electrode layer 134, and the second barrier layer 136 on the insulating layer 120 in succession by CVD (Chemical Vapor Deposition) and by patterning the layers 132, 134, and 136 deposited by photolithography and etching, a plurality of lower electrodes (e.g. 130-1 and 130-2) may be formed.

Referring to FIG. 2, the patterning by the photolithography and etching may expose or open sides of the first main electrode layers 134 of the first lower electrode 130-1 and the second lower electrode 130-2 from the first and second barrier layers 132 and 136, respectively, in accordance with embodiments. In embodiments, the patterning by the photolithography and etching may expose or open a portion of the insulating layer 120 (e.g. a portion of an upper side of the insulating layer 120.

Figure 3:
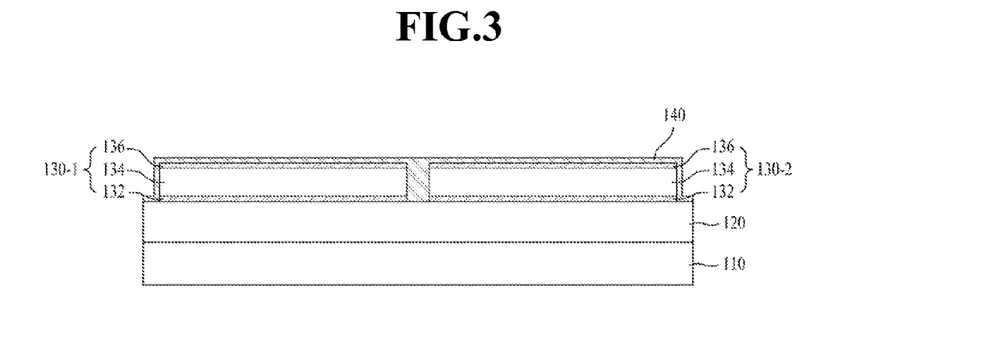

Referring to FIG. 3, a stop film 140 may be formed on/over the insulating layer 120 to cover the lower electrode pattern 130, in accordance with embodiments. For example, in embodiments, the stop film 140 may be formed on exposed sides of the first and second barrier layers 132, an upper side of the barrier layer 136, and the portion of the insulating layer 120 exposed (e.g. illustrated in FIG. 2).

Figure 7:
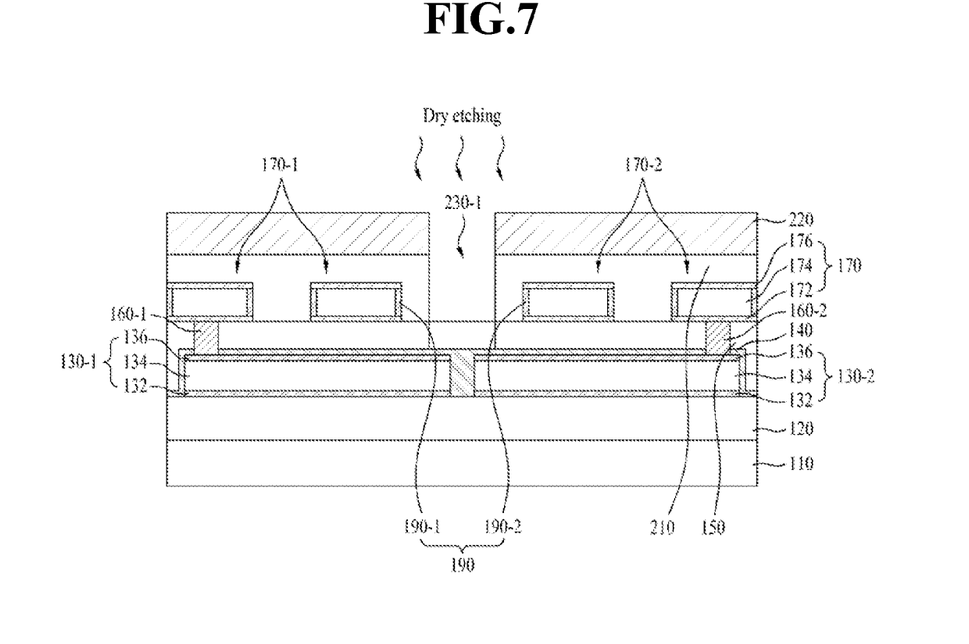
Figure 8:
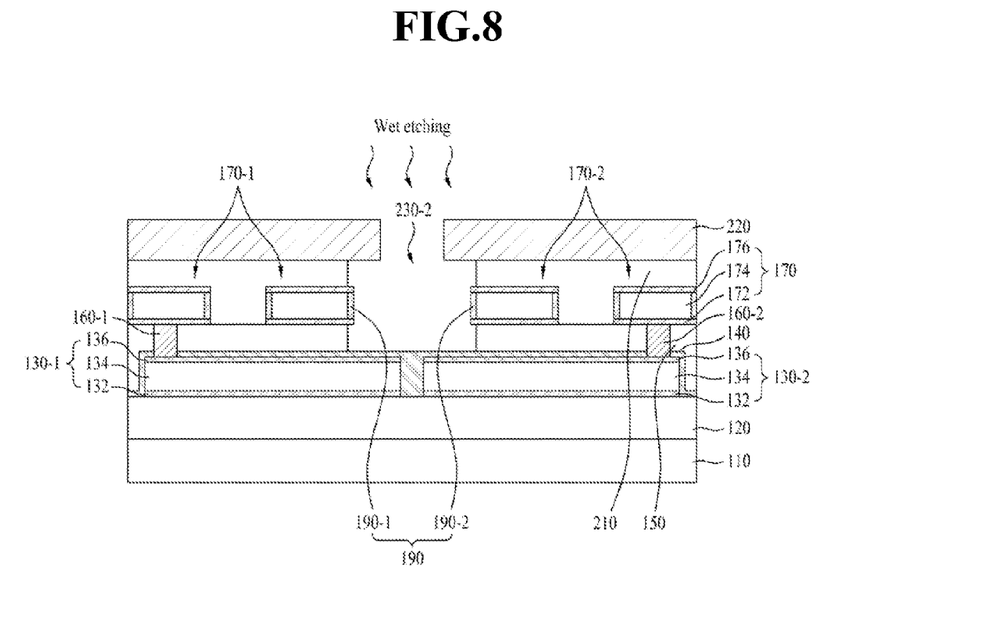

The stop film 140 may serve as an etch stop film resulting in a space 230-1 and/or 230-2 shown in FIG. 7 or 8, in accordance with embodiments. In embodiments, space 230-1 and/or 230-2 may be configured to position a contact ball. The stop film 140 may be formed of a material having an etch selectivity higher than an interlayer insulating layer 150 (e.g. silicon nitride or SiN or similar), in accordance with embodiments.

Figure 4:
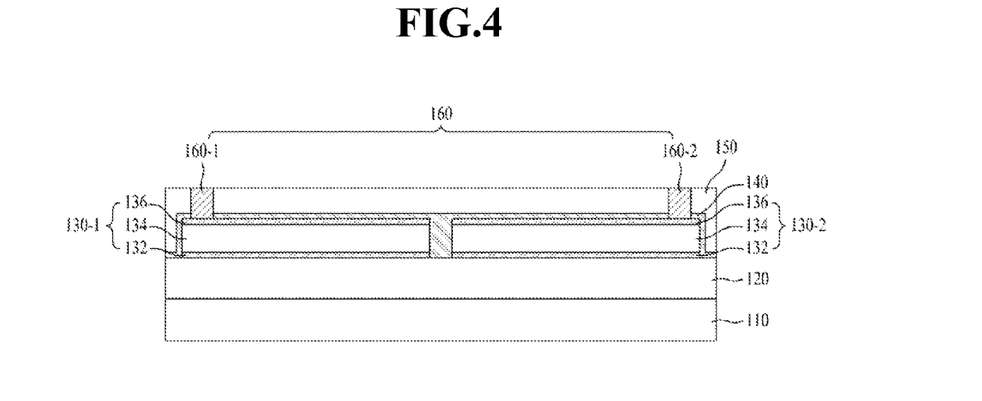

FIG. 4 illustrates the first interlayer insulating layer 150 formed on/over the stop film 140, in accordance with embodiments. For example, the first interlayer insulating layer 150 may be formed on/over the stop film 140 by CVD (Chemical Vapor Deposition). In embodiments, first interlayer insulating layer 150 may include at least one of an oxide and/or a nitride (e.g. SiO2, SixNy (where x and y are real numbers), FSG (Fluoro Silicate glass), USG (Undoped Silicate Glass), BPSG (Boron Phospho Silicate Glass), and TEOS (TetraEthOxySilane), and/or similar).

A plurality of contacts 160 may be formed which are in contact with the lower electrode pattern 130 that passes through the first interlayer insulating layer 150 and the stop film 140, in accordance with embodiments. For example, a first contact 160-1 in contact with the first lower electrode 130-1 may pass through a region of each of the first interlayer insulating layer 150, the stop film 140, and/or a second contact 160-2. In embodiments, second contact 160-2 may be in contact with the first lower electrode 130-2 that passes through where the first interlayer insulating layer 150 and/or the stop film 140 may be formed. Although FIG. 4 only illustrates two contacts, the number of contacts are not limited to this example (e.g. the number of contacts may be three or more in embodiments). In embodiments, at least one contact may be formed to be in contact with the plurality of lower electrodes (e.g. 130-1 and 130-2).

In alternative embodiments, a photoresist pattern may be formed on the first interlayer insulating layer 150. The first interlayer insulating layer 150 and the stop film 140 may be etched using a photoresist pattern as an etch mask to form a via hole. A conductive material (e.g. tungsten) may be filled in the via hole formed and planarized (if necessary) to form the contact, in accordance with embodiments.

Figure 5:
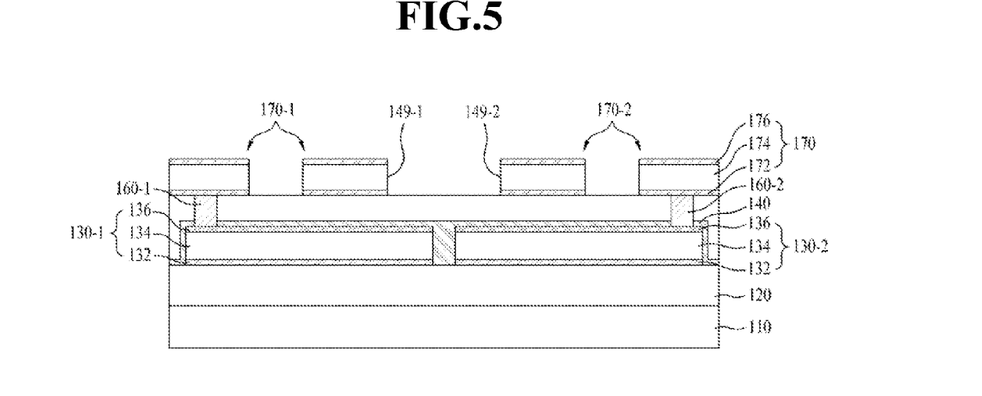

FIG. 5 illustrates an upper electrode pattern 170 formed on/over the first interlayer insulating layer 150, in accordance with embodiments. The upper electrode pattern 170 may have a structure having a stack of a third barrier layer 172, a second main electrode layer 174, and/or a fourth barrier layer 176, in accordance with embodiments. The third barrier layer 172 and the fourth barrier layer 176 may substantially prevent metal ions from the second main electrode layer 174 from diffusing into other layers (e.g. the first and second interlayer insulating layers 150 and 210), in accordance with embodiments.

In embodiments, the third and fourth barrier layers 172 and 176 may be formed of a barrier metal material (e.g. TiN, Ti, a TiN/Ti alloy, and/or similar). In embodiments, the second main electrode layer 174 may be formed of a material having good conductivity (e.g. Al, Cu, Au, an Al—Cu alloy, and/or similar).

The upper electrode pattern 170 may include a plurality of upper electrodes (e.g. 170-1 and 170-2) spaced from one another and substantially electrically isolated from each other, in accordance with embodiments. For example, the upper electrode pattern 170 may include the first upper electrode 170-1 and the second upper electrode 170-2. However, in embodiments, the number of upper electrodes may be greater than two.

For example, the third barrier layer 172, the second main electrode layer 174, and the fourth barrier layer 176 may be deposited on/over the first interlayer insulating layer 150 (e.g. by Chemical Vapor Deposition). Layers 172, 174, and 176 may then be patterned by photolithography and/or etching. The plurality of the upper electrodes (e.g. 170-1, and 170-2) may be formed spaced apart from one another.

The patterning by photolithography and/or etching may expose sides of the plurality of the upper electrodes (e.g. 170-1, and 170-2), in accordance with embodiments. For example, sides 149-1 and 149-2 of the second main electrode layers 174 in the plurality of the upper electrodes (e.g. 170-1, and 170-2) may be exposed or opened from the third or fourth barrier layers 172 and 176. In embodiments, the patterning by photolithography and/or etching may expose and/or open a portion of the first interlayer insulating layer 150 (e.g. a portion of an upper side of the first interlayer insulating layer 150).

The upper electrode pattern 170 may be electrically connected to the lower electrode pattern 130 with the contact 160, in accordance with embodiments. For example, the first upper electrode 170-1 may be connected to the first contact 160-1 electrically and the second upper electrode 170-2 may be connected to the second contact 160-2 electrically.

At least one of the plurality of the upper electrodes may be positioned on the contact 160 and may be in contact to the contact 160, in accordance with embodiments. For example, a portion of the first upper electrode 170-1 may be positioned on the first contact 160-1 and may be in contact with the first contact 160-1. A portion of the second upper electrode 170-2 may be positioned on the second contact 160-2 and may be in contact with the second contact 160-2.

Figure 6:
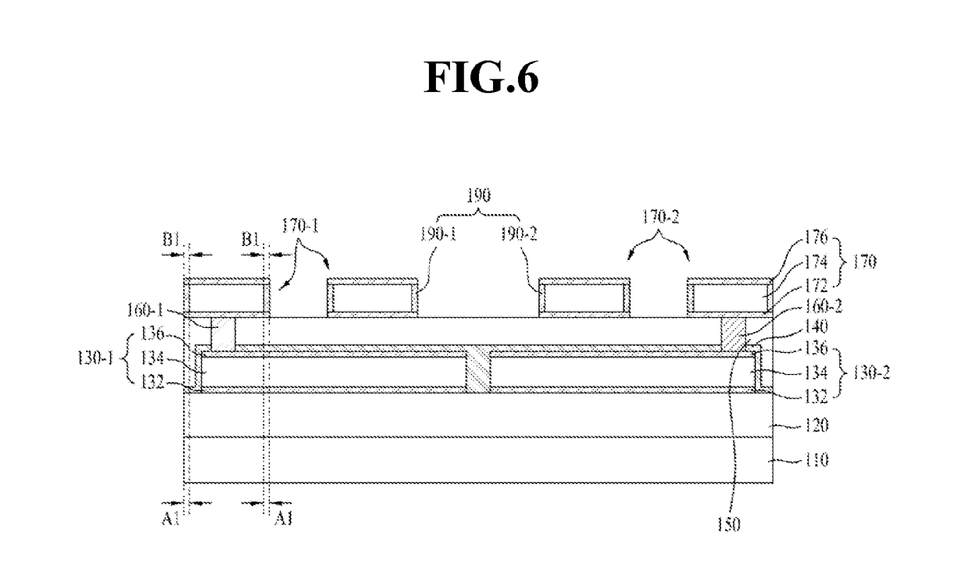

FIG. 6 illustrates at least a portion of the side of the upper electrode pattern 170 (which may be oxidized), to form a passivation layer 190 covering the side of the upper electrode pattern 170, in accordance with embodiments. By oxidizing exposed sides 149-1 and 149-2 of the second main electrode layer 174 of each of the upper electrodes (e.g. 149-1 and 149-2), a region of the second main electrode layer 174 may be turned into oxide. A portion of the second main electrode layer 174 turned to oxide may serve as a passivation layer 190 for protecting the second main electrode layer 174 from a second subsequent etching in a later step. The passivation layer 190 may formed to have a thickness of between approximately 5 Å and 100 Å, in accordance with embodiments. For example, a portion of the second main electrode layer 174 positioned between an edge of the third barrier layer 172 and an edge of the fourth barrier layer 176 may be oxidized to form the passivation layer 190.

In embodiments, it may be required that the passivation layer 190 has a thickness of at least approximately 5 Å to serve as a protective layer. In embodiments, in order to prevent the third barrier layer 172 and the fourth barrier layer 174 from oxidizing and taking the resistance change of the upper electrodes into account, it may be required that the passivation layer 190 has a thickness below approximately 100 Å. For example, the side of the second main electrode layer 174 may be oxidized by oxidation with gas including H2O2 and H2O. Oxide formed in this case may include at least one of Al2O3, Cu2O, AuOX (where x is a real number) or an oxidized Al—Cu alloy. In embodiments, composition of the oxide may be determined according to composition of the second main electrode layer 174. In embodiments, if the second main electrode layer 174 includes a plurality of layers and each of the plurality of layers are formed of materials different from one another, the passivation layer 190 may include a plurality of layers formed of materials different from one another.

In embodiments, it may be required that the third barrier layer 172 and the fourth barrier layer 176 have electric contact with the contact ball 240. Accordingly, in embodiments, prevention of forming the passivation layer 190 on surfaces of the third barrier layer 172 and the fourth barrier layer 176 by the oxidation may be implemented. Oxidation reactions of the third barrier layer 172 and the fourth barrier layer 176 may not be easier than the second main electrode layer 174. Accordingly, in embodiments, even if the side of the second main electrode layer is oxidized, the surfaces of the third barrier layer 172 and the fourth barrier layer 176 may be prevented from being oxidized. According to embodiments, the passivation layer 190 may be formed to a predetermined thickness from the side of the main electrode layer 174, while passivation layers 190 are substantially prevented from being formed on the surfaces of the third barrier layer 172 and the fourth barrier layer 176.

FIG. 7 illustrates a second interlayer insulating layer 210 formed on/over the first interlayer insulating layer 150 covering the upper electrode pattern 170 having the passivation layer 190 formed thereon, in accordance with embodiments. The second interlayer insulating layer 210 may be formed of the same material, and by the same method, as the first interlayer insulating layer 150, in accordance with embodiments.

In embodiments, a photoresist pattern 220 may be formed on the second interlayer insulating layer 210 by photolithography. The photoresist pattern 220 may expose at least a portion of an upper surface of the second interlayer insulating layer 210 positioned between the plurality of the upper electrodes (e.g. 170-1 and 170-2), in accordance with embodiments.

In embodiments, a first etching may be performed, in which the second interlayer insulating layer 210 may be exposed. The first interlayer insulating layer 150 may be etched by using the photoresist pattern 220 as an etch mask to form a hole 230-1 which exposes the stop film 140, in accordance with embodiments. The first etching may be dry etching, in embodiments. The stop film 140 may serve as an etch stop film in the first etching and/or the hole 230-1 may expose a portion of the stop film 140, in accordance with embodiments. In embodiments. In embodiments, exposure of the passivation layer 190 may be substantially prevented.

FIG. 8 illustrates a second etching being performed in which the second interlayer insulating layer 210 and the first interlayer insulating layer 150 may be etched in the first etching using the photoresist pattern 220 as an etch mask, in accordance with embodiments. This etching may form a cavity 230-2 which exposes the passivation layer 190, in accordance with embodiments. The cavity 230-2 may be formed to have a diameter R1 larger than a diameter R2 of a contact ball, in accordance with embodiments.

In embodiments, only passivation layer 190 may be positioned on one side of the upper electrode (e.g. 170-1, or 170-2) which is adjacent to the cavity 230-2 in which a contact ball is later positioned and/or may face the cavity 230-2. In embodiments, the second etching may also expose a side and/or a portion of an upper side and/or a portion of an underside of each of the third barrier layer 172 and the fourth barrier layer 176 adjacent to the passivation layer 190.

The second etching may be a wet etching using an etchant which is a mixture of DIW (Deionizer Water) mixed with an HF group chemical (or similar), for example and in accordance with embodiments. In the second etching, the etchant may flows into the hole 230-1 to etch the second interlayer insulating layer 210 and the first interlayer insulating layer 150.

In embodiments, the second etching may include at least one of the following steps: (1) the first step may include etching for approximately 1 to 20 minutes with DHF (Diluted HF) with an HF to H2O ratio of approximately 1~1000:1, and (2) the second step may include etching for 1 to 20 minutes with BHF (Buffered HF) with an NH4F to HF ratio of approximately 3~100:1.

In embodiments, the passivation layer 190-1 and 190-2 may serve to protect the first upper electrode 170-1 and the second upper electrode 170-2 from the second etching. Since the passivation layer 190 may have an etch selectivity higher than the interlayer insulating layer 210 and 150, the passivation layer 190 may be substantially prevented from being etched in the second etching, in accordance with embodiments. In embodiments, the passivation layer 190 may protect the first upper electrode 170-1 and the second upper electrode 170-2 from the second etching. Accordingly, in embodiments, even after the second etching is finished, the passivation layer 190-1 and 190-2 may remain on the sides of the upper electrode pattern 170. In embodiments, the passivation layer 190 remains thus may have a thickness between approximately 4 Å and 99 Å. In embodiments, the cavity 230-2 may expose the stop film 140 and the stop film 140 may serve as an etch stop film which substantially prevents the lower electrode pattern 130 from being damaged. The material of the second main electrode layer 174 of both the first upper electrode 170-1 and the second upper electrode 170-2 (e.g. Cu, Al, Au, a Cu—Al alloy, or similar) may be susceptible to damage by the etchant in the second etching.

In embodiments without the passivation layer 190, the second interlayer insulating layer 210 and the first interlayer insulating layer 150 may be etched in the second etching to expose a an upper side of both the first upper electrode 170-1 and the second upper electrode 170-2. Accordingly, the side of the second main electrode layer 174 of both the first upper electrode 170-1 and the second upper electrode 170-2 may be susceptible to damage by the etchant in the second etching, which may ultimately cause switching malfunctions in the semiconductor device, which may indicate that reliability and yield of the semiconductor device is not optimized.

In embodiments, by forming the passivation layer 190 to cover the side of the main electrode layer 174 of each of the first and second upper electrodes 170-1 and 170-2 (which may be susceptible to damage by the etchant during wet etching), the second main electrode layer 174 of both the first upper electrode 170-1 and the second upper electrode 170-2 may be prevented from being etched and damaged by the etchant in the second etching.

In embodiments, the upper electrode pattern 170 is formed using a material insensitive to the etchant used in the wet etching. This may secure the cavity 230-2 in which the contact ball is positioned, which may enable improved degrees of freedom of the upper electrode pattern 170, in accordance with embodiments. This may optimize reliability of switching in the semiconductor device and/or may optimize yield, in accordance with embodiments.

Figure 9:
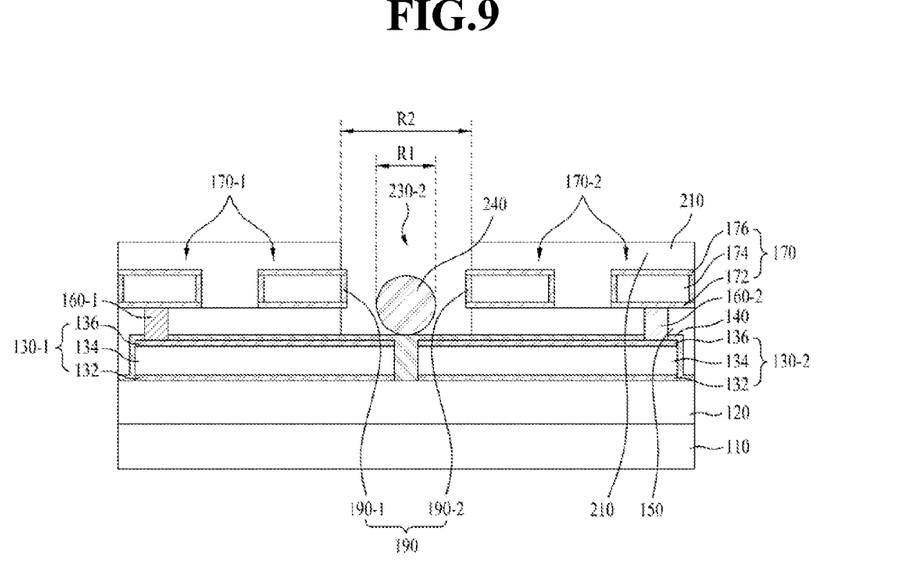

Referring to FIG. 9, the contact ball 240 may be formed on the stop film 140 in the cavity 230-2, in accordance with embodiments. For example, the contact ball 240 may be formed using at least one of the following steps: (1) A conductive material layer (e.g. a metal layer) may be formed on/over the stop film 140 in the photoresist pattern 220 and the cavity 230-2. (2) A lift-off may be performed to remove the photoresist pattern 220 and the conductive material layer positioned thereon. In embodiments, the lift-off may not remove the conductive material layer positioned on the stop film 140 in the cavity 230-2, thus leaving a portion of the conductive material on/over the stop film 140 in the cavity 230-2. (3) The portion of the conductive material remaining in the cavity 230-2 may be subjected to annealing to form the contact ball 240 on the stop film 140 in the cavity 230-2. In embodiments, the cavity 230-2 may form an air void and as the contact ball 240 may be brought into contact with any one of the barrier layers 172 and 176. (4) The semiconductor device may perform a switching action.

Figure 1:
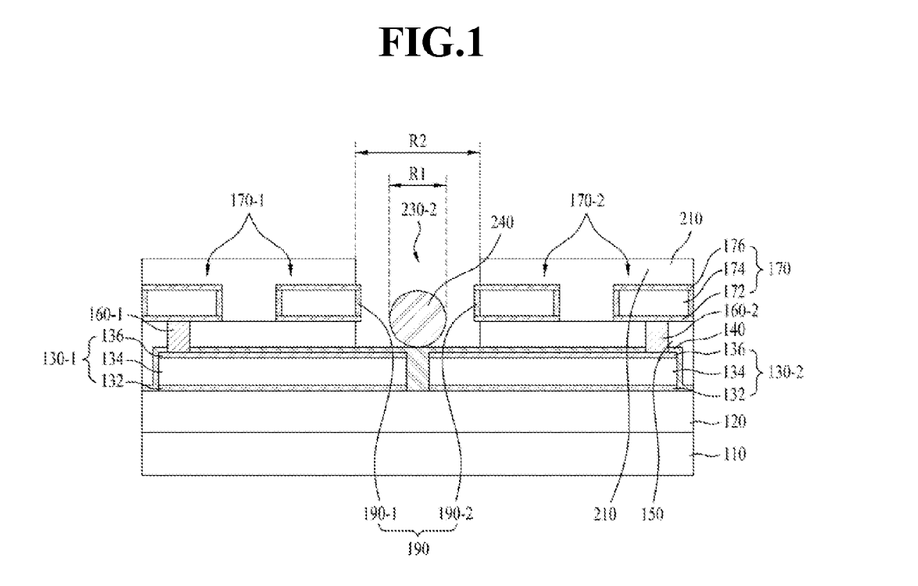
FIG. 1 illustrates a section of a semiconductor device, in accordance with embodiments.

FIG. 1 illustrates a section of a semiconductor device 100 in accordance with embodiments. The semiconductor device 100 may be a Micro Metal Sphere switch, in accordance with embodiments. The semiconductor device 100 may include at least one of: (1) an insulating layer 120 formed on/over a substrate 110, (2) a lower electrode pattern 130 formed on/over the insulating layer 120, (3) a stop film 140 formed on/over the lower electrode pattern 130, (4) a first interlayer insulating layer 150 formed on/over the stop film 140, (5) a contact 160 connected to the lower electrode pattern 130 passed through the first interlayer insulating layer 150, (6) an upper electrode pattern 170 formed on/over the first interlayer insulating layer 150 connected to the contact, (7) a second interlayer insulating layer 210 formed on/over the upper electrode pattern 170, (8) a cavity 230-2 formed in the second interlayer insulating layer 210 and the first interlayer insulating layer 150 exposing a side of the upper electrode pattern 170 and the stop film 140, (9) a passivation layer 190 formed on/over a portion of a side of the upper electrode pattern 170 exposing the cavity 230-2, and (10) a contact ball 240 positioned on/over the stop film 140 in the cavity 230-2.

In embodiments, the passivation layer 190 may be an oxide of the material of the second main electrode layer 174 of the upper electrode pattern 170. For example, the photoresist pattern 220 may include at least one of Al2O3, Cu2O, AuOX (where x is a real number) or an oxidized Al—Cu alloy.

Although the passivation layer 190 may be formed on a side of the second main electrode layer 174, the passivation layer 190 may be prevented from being formed on a surface of the third barrier layer 172 and the fourth barrier layer 176, in accordance with embodiments. Accordingly, in embodiments, the third barrier layer 172 and the fourth barrier layer 176 of the upper electrode pattern 170 may be exposed from the photoresist pattern 220.

The passivation layer 190 may be positioned between an edge of the third barrier layer 172 and an edge of the fourth barrier layer 176, in accordance with embodiments. In embodiments, the passivation layer 190 may overlap with the third barrier layer 172 and the fourth barrier layer 176 in a vertical direction. The vertical direction may be a direction the third barrier layer 172 faces the fourth barrier layer 174. The passivation layer 190 may be in contact with the side of the main electrode layer 174.

The cavity 230-2 may expose a first side of the first passivation layer 190-1 positioned on/over the second main electrode layer 174, and a second side of the second passivation layer 190-2 positioned on the second main electrode layer 174, in accordance with embodiments. The first side may face the second side.

In embodiments, the cavity 230-2 may expose one side of the third barrier layer 172 and the fourth barrier layer 176 of both the first upper electrode 170-1 and the second upper electrode 170-2. In embodiments, the cavity 230-2 may expose a portion of an underside of the third barrier layer 172 adjacent to an exposed side of the third barrier layer 172 and a portion of an upper side of the fourth barrier layer 176 adjacent to an exposed side of the fourth barrier layer 176.

The contact ball 240 may be brought into contact with the portions of the third barrier layer 172 and the fourth barrier layer 176 exposed by the cavity 230-2. Switching actions of the semiconductor device may be set or fixed depending on which one of the exposed portions of the barrier layers 172 and 176 of the first upper electrode 170-1 and/or the exposed portions of the barrier layers 172 and 176 of the second upper electrode 170-2 when they are brought in contact with the contact ball 240, in accordance with embodiments.

For example, the upper electrode pattern 170 may include a third upper electrode electrically isolated from the first upper electrode 170-1 and the second upper electrode 170-2. In embodiments, the upper electrode pattern 170 may include barrier layers and a main electrode layer positioned therebetween. In embodiments, a third passivation layer may cover a side of a main electrode layer of the third upper electrode. The third upper electrode and the barrier layers may be exposed by the cavity 230-2, in accordance with embodiments.

In embodiments, if the contact ball 240 is brought into contact with the exposed portion of the barrier layer 172 or 176 of the first upper electrode 170-1 and the exposed portion of the barrier layer of the third upper electrode at the same time, a first switching may take place, in which the first upper electrode 170-1 and the third upper electrode are electrically connected. In embodiments, if the contact ball 240 is brought into contact with the exposed portion of the barrier layer 172 or 176 of the second upper electrode 170-2 and the exposed portion of the barrier layer of the third upper electrode at the same time, a second switching may take place, in which the second upper electrode 170-2 and the third upper electrode are electrically connected.

It will be apparent to those skilled in the art that various modifications and variations can be made to embodiments without departing from the spirit or scope of the embodiments. Thus, it is intended that the embodiments cover the modifications and variations of these embodiments provided they come within the scope of the appended claims and their equivalents.

What is claimed is:

1. A method comprising:
    forming a lower electrode pattern over a substrate;
    forming a first interlayer insulating layer over the lower electrode pattern;
    forming an upper electrode pattern over the first interlayer insulating layer;
    forming a passivation layer over a side of the upper electrode pattern;
    forming a second interlayer insulating layer over the upper electrode pattern;
    etching the second interlayer insulating layer to form a cavity, wherein the cavity exposes the passivation layer; and
    forming a contact ball in the cavity,
    wherein said forming the passivation layer comprises oxidizing at least a portion of the side of the upper electrode pattern to form the passivation layer.

2. A method comprising:
    forming a lower electrode pattern over a substrate;
    forming a first interlayer insulating layer over the lower electrode pattern;
    forming an upper electrode pattern over the first interlayer insulating layer;
    forming a passivation layer over a side of the upper electrode pattern;
    forming a second interlayer insulating layer over the upper electrode pattern;
    etching the second interlayer insulating layer to form a cavity, wherein the cavity exposes the passivation layer; and
    forming a contact ball in the cavity, wherein:
    said forming an upper electrode pattern comprises forming a plurality of upper electrodes spaced from one another over the first interlayer insulating layer,
    said forming an upper electrode pattern comprises forming the plurality of upper electrodes each having a stack of a lower barrier layer, a main electrode layer, and an upper electrode layer, and
    the cavity exposes the lower barrier layer and the upper barrier layer adjacent to the passivation layer.

3. The method of claim 2, wherein said forming a passivation layer comprises oxidizing the side of the main electrode layer to form the passivation layer.

4. The method of claim 2, wherein said forming a passivation layer includes the step of oxidizing a portion of the main electrode layer positioned between an edge of the lower barrier layer and an edge of the upper barrier layer to form the passivation layer.

5. The method of claim 2, wherein the cavity exposes a side of the lower barrier layer, a portion of an underside of the lower barrier layer adjacent to the side of the lower barrier layer exposed thus, a side of the upper barrier layer, and a portion of an upper side of the upper barrier layer adjacent to the side of the upper barrier layer exposed thus.

6. A method, comprising:
    forming a lower electrode pattern over a substrate;
    forming a first interlayer insulating layer over the lower electrode pattern;
    forming an upper electrode pattern over the first interlayer insulating layer;
    forming a passivation layer over a side of the upper electrode pattern;
    forming a second interlayer insulating layer over the upper electrode pattern;
    etching the second interlayer insulating layer to form a cavity, wherein the cavity exposes the passivation layer;
    forming a contact ball in the cavity; and
    forming a stop film between the lower electrode pattern and the first interlayer insulating layer.

7. The method of claim 6, comprising forming a contact in contact with the lower electrode pattern passed through the first interlayer insulating layer and the stop film, wherein said the second upper electrode pattern is formed to be in contact with the contact.

* * * * *